United States Patent
Lazar et al.

(10) Patent No.: US 9,684,043 B2
(45) Date of Patent: Jun. 20, 2017

(54) MOUNTING FOR A BODY COIL OF A MAGNETIC RESONANCE DEVICE

(71) Applicants: Razvan Lazar, Erlangen (DE); Martin Schramm, Erlangen (DE)

(72) Inventors: Razvan Lazar, Erlangen (DE); Martin Schramm, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 466 days.

(21) Appl. No.: 14/316,407

(22) Filed: Jun. 26, 2014

(65) Prior Publication Data

US 2015/0002154 A1    Jan. 1, 2015

(30) Foreign Application Priority Data

Jun. 27, 2013 (DE) .................. 10 2013 212 461

(51) Int. Cl.
*G01V 3/00* (2006.01)
*G01R 33/34* (2006.01)

(52) U.S. Cl.
CPC . *G01R 33/34007* (2013.01); *G01R 33/34046* (2013.01); *Y10T 29/4902* (2015.01)

(58) Field of Classification Search
CPC ............................................. G01R 33/34007
USPC ................................ 324/318, 319, 320, 321
See application file for complete search history.

(56) References Cited

U.S. PATENT DOCUMENTS

| | | | | |
|---|---|---|---|---|
| 4,560,933 A | * | 12/1985 | Forster .............. | G01R 33/3802 324/319 |
| 5,084,676 A | * | 1/1992 | Saho .................. | G01R 33/3854 324/318 |
| 5,400,787 A | * | 3/1995 | Marandos ............ | A61B 5/0555 324/318 |
| 6,160,399 A | * | 12/2000 | Radziun .............. | G01R 33/385 324/319 |

(Continued)

FOREIGN PATENT DOCUMENTS

| DE | 60032976 T2 | 11/2007 |
|---|---|---|
| WO | 2006/054187 A1 | 5/2006 |

OTHER PUBLICATIONS

German Office Action dated Nov. 14, 2013 for corresponding German Patent Application No. DE 10 2013 212 461.9 with English translation.

*Primary Examiner* — Louis Arana
(74) *Attorney, Agent, or Firm* — Lempia Summerfield Katz LLC (57) ABSTRACT

A mounting device for a body coil of a magnetic resonance device is provided. The mounting device includes a suspension device that has at least one suspension element. The at least one suspension element is mechanically connectable to a counterpart piece of the body coil. The suspension device is configured for suspension and coarse adjustment of the body coil in the magnetic resonance device during an adjustment process of the body coil. The mounting device also includes an adjustment device that has an adjuster for changing a position of the body coil, and adjustment indicators for displaying the position of the body coil. The adjustment device is provided for fine adjustment of the body coil during the adjustment process. The mounting device includes an attachment device differing from the suspension device. The attachment device includes at least (Continued)

one attachment element for mechanical interaction with the body coil.

21 Claims, 3 Drawing Sheets

(56) References Cited

U.S. PATENT DOCUMENTS

| | | | |
|---|---|---|---|
| 6,252,404 B1 | 6/2001 | Purgill et al. | |
| 6,882,152 B2* | 4/2005 | Schuster | G01R 33/3858 324/318 |
| 7,191,513 B2* | 3/2007 | Schuster | G01R 33/3858 29/281.1 |
| 2015/0002151 A1* | 1/2015 | Lazar | G01R 33/0052 324/318 |
| 2015/0338481 A1* | 11/2015 | Watanabe | G01R 33/3854 324/322 |

* cited by examiner

MOUNTING FOR A BODY COIL OF A MAGNETIC RESONANCE DEVICE

This application claims the benefit of DE 10 2013 212 461.9, filed on Jun. 27, 2013, which is hereby incorporated by reference in its entirety.

BACKGROUND

The present embodiments relate to mounting of a body coil in a magnetic resonance device.

The body coil is an essential component of every magnetic resonance device. The body coil is used to transmit the high-frequency excitation pulse and to receive the magnetic resonance signal. For reasons of symmetry, the body coil is to be mounted within the magnetic resonance device in a concentric manner in relation to the internal surface of the gradient coil system of the magnetic resonance device. The body coil is also to be attached in a stable manner within the magnetic resonance device. Conventional mounting devices for body coils provide for the adjustment of the position of the body coil to take place under the full weight of the body coil.

SUMMARY AND DESCRIPTION

The scope of the present invention is defined solely by the appended claims and is not affected to any degree by the statements within this summary.

The present embodiments may obviate one or more of the drawbacks or limitations in the related art. For example, attachment and adjustment of a body coil separately from each other during mounting of the body coil are provided.

A mounting device for a body coil of a magnetic resonance device includes a suspension device that has at least one suspension element configured to be connectable mechanically to a counterpart piece of the body coil. The suspension device is provided for suspension and coarse adjustment of the body coil in the magnetic resonance device during an adjustment process of the body coil. The mounting device also includes an adjustment device that has an adjuster for changing the position of the body coil and adjustment indicators for displaying the position of the body coil. The adjustment device is provided for fine adjustment of the body coil during the adjustment process. The mounting device includes an attachment device differing from the suspension device. The attachment device includes at least one attachment element provided for mechanical interaction with the body coil. The attachment device is provided for mechanical accommodation of the body coil in the magnetic resonance device.

Via the suspension device, temporary securing of the body coil is effected during the adjustment process. During the adjustment process, no further attachment elements must be employed to secure the body coil in the magnetic resonance device. In contrast to conventional mounting devices for body coils, in which the adjustment of the body coil takes place under the full weight load of the body coil, the suspension of the body coil during the adjustment process brings the following advantage: the dead weight of the body coil damps the oscillation behavior of the body coil, and results in the body coil automatically hanging in a stable vertical position. Solely through the suspension of the body coil, an approximately optimal position of the body coil is thereby achieved, and a coarse adjustment of the body coil is performed.

The mechanical accommodation of the body coil takes place after completion of the adjustment process through attachment of the body coil using an attachment device that differs from the suspension device. This has at least one attachment element that interacts mechanically with the body coil. This may provide that the attachment element is connected mechanically to the body coil, for example, by screws. As described below, the attachment element may further fix the body coil through pressure against the exterior wall of the body coil.

After completion of the adjustment process, the suspension device may be removed from the magnetic resonance device. Alternatively, the mechanical accommodation of the body coil in the magnetic resonance device may take place by the suspension device together with the attachment device. After the adjustment procedure, the adjustment device may likewise be removed from the magnetic resonance device, so that the adjustment device does not interfere with the magnetic resonance imaging through vibration. Accommodation of the adjustment device in the vicinity of the magnetic resonance device is then advantageous, so that a service engineer enjoys rapid access to the adjustment device.

A very robust attachment of the body coil may be provided through separation of the adjustment and attachment of the body coil. This may withstand high static and dynamic stresses, while nevertheless not affecting the highly delicate structure of the adjustment unit, which enables adjustment of the body coil with an accuracy of fractions of a millimeter. As a result of the separation of the attachment and adjustment of the body coil, the necessary stability of the attachment device no longer conflicts with the requisite flexibility of the adjustment device. The attachment of the body coil may also be implemented such that a preceding adjustment of the body coil need not be retrospectively changed.

The suspension device, the adjustment device and the attachment device may be embodied such that the adjustment device and the attachment device enable mounting of the body coil subject to a strong magnetic field. The elements of the devices may at least in part include non-magnetic materials (e.g., plastic).

According to an embodiment, the suspension element may be positioned along an axis defined by the gravitational effect of the body coil on the side opposite to the gravitational effect of the body coil. Suspension of the body coil via two suspension elements, which are located vertically above the body coil, is advantageous. The body coil may, for example, be suspended at two ends in a longitudinal direction. A suspension at two points results in a stress-free accommodation of the body coil. The body coil may also be suspended at more than two points with more than two suspension elements.

In a further embodiment, the suspension element is embodied as a ball joint that may be connected at one end to a counterpart piece of the body coil and has a ball at the other end. The ball joint is mounted movably in a socket. The position of the ball may be locked within the socket. The ball joint offers improved flexibility during the adjustment procedure, and may be clamped firmly in position by the locking of ball and socket.

One advantageous embodiment provides for the adjuster to have at least one adjustment system. The at least one adjustment system may be connected mechanically to a component of the magnetic resonance device at a first location, and the adjustment system has a second location that is provided to interact mechanically with the body coil. The position of the second location may be adjusted relative to the position of the first location. The adjustment system may be realized as a sliding rail system or as an elongated hole system. The adjustment system is, for example, to permit a readjustment of the position of the body coil in relation to the three spatial directions.

According to an advantageous embodiment, the adjustment system may be connected to the suspension device at the second location. The adjustment system then interacts mechanically with the body coil via the suspension device at a second location. The readjustment of the adjustment system, for example, leads to a readjustment of the position of the suspension elements of the suspension device and thus to a readjustment of the position of the body coil.

One embodiment provides for the adjuster to have micrometer screws that are embodied such that the screws enable a readjustment of the position of the second location of the adjustment system relative to the position of the first location of the adjustment system. The micrometer screws are, for example, connected mechanically to the adjustment system, so that a readjustment of the micrometer screws leads to a readjustment of the adjustment system. With micrometer screws, the position of the body coil may be set with an accuracy of micrometers. For example, in the two spatial directions perpendicular to the longitudinal axis of the body coil, the setting of the position of the body coil may take place with an accuracy of micrometers, and thus using micrometer screws. This precision is not always required along the longitudinal axis of the body coil.

According to a further embodiment, the micrometer screws include markings that enable a reproducible setting of the micrometer screws. Using the markings, once identified, a setting of the micrometer screws may be read off and recorded, and accurately reproduced once again if required. This is, for example, used in the event of servicing, when the body coil is to be removed from the magnetic resonance device and subsequently reinstalled in exactly the same position.

According to an advantageous embodiment, the adjustment indicators have at least one distance sensor, where the distance sensor is configured for measuring the distance between a reference component of the magnetic resonance device and the body coil. The reference component of the magnetic resonance device may be the internal surface of the gradient coil system. Alternatively, the distance between the body coil and the main field magnet or another component of the magnetic resonance device may also be measured.

One advantageous embodiment provides for the distance sensor to have a spring, where a first end of the spring is fixed to the body coil, and a measuring pin is attached to a second end of the spring. An end of the measuring pin not pointing towards the spring may be oriented in the direction of the reference component of the magnetic resonance device. The end of the measuring pin not pointing towards the spring then presses against the surface of the reference component of the magnetic resonance device and pushes the measuring pin against the force of the spring. The position of the measuring pin thus specifies the local distance between the body coil and the reference component of the magnetic resonance device. An implementation of a plurality of measuring pins at both ends of the body coil in a longitudinal direction of the body coil is advantageous, where the plurality of measuring pins may be attached equally distributed over the full extent of the body coil. Both the measuring pins and the spring may include non-magnetic materials. The spring may, for example, include a bronze-beryllium alloy. A reverse implementation of this distance sensor, in which the first end of the spring is fixed to the reference component of the magnetic resonance device, and the end of the measuring pin not pointing towards the spring is oriented in the direction of the body coil, may be provided. This implementation does, however, make it more difficult to read off the position of the measuring pin.

According to a further embodiment, the measuring pin includes markings that are disposed in stages along the measuring pin, so that the markings enable the distance between the body coil and the reference component of the magnetic resonance device to be read off. The graduation of the markings may, for example, be color-coded, thus enabling rapid reading-off and a rough assessment of the position of the measuring pin. A scale may also be used as a marking The exact position of the measuring pins may then be determined with a dedicated measuring tool (e.g., a non-magnetic caliper rule).

One embodiment provides for the attachment element to be embodied as a support element, where the support element has a mounting on the end pointing towards an attachment location of the magnetic resonance device and configured to enable a mechanical connection of the support element to the attachment location. The support element has a stamp on an end opposite to the end pointing towards the attachment location and adjustable in the direction of the longitudinal axis of the support element, for the mechanical fixing of the body coil. The mechanical fixing of the body coil may, for example, take place through pressing of the stamp against the exterior wall of the body coil. An attachment of the body coil with in each case at least three (e.g., four) support elements on both ends of the body coil in the longitudinal direction of the body coil is advantageous. The support elements may be arranged equally distributed over the full extent of the body coil.

According to a further embodiment, the support element has an adjustable damping mechanism between the mounting and the stamp. By adjusting the damping mechanism, the pressure of the stamp against the exterior wall of the body coil may be regulated. The damping mechanism may thus be embodied such that for the vibration of the body coil during the magnetic resonance imaging, only such frequencies that do not interact with the imaging frequencies in any way (e.g., through the Moire effect) may arise.

A further embodied provides for the attachment element to be embodied as a support device for the body coil, where the support device is provided for mechanical connection to an attachment location of the magnetic resonance device and has at least one resting point for the body coil. The mechanical accommodation of the body coil in the magnetic resonance device may take place, for example, using a combination of support elements and a support device. The weight of the body coil is then supported by the support device, and the position of the body coil may be set through readjustment of the support elements.

In one embodiment of a method for mounting of a body coil in a magnetic resonance device, the body coil is suspended and coarsely adjusted by a suspension device during an adjustment process of the body coil in the magnetic resonance device. The body coil is connected mechanically to the suspension device using at least one suspension element. The body coil is finely adjusted using an adjustment device during the adjustment process, where the position of the body coil changes using an adjuster and is indicated by adjustment indicators. The body coil interacts mechanically with at least one attachment element of an attachment device differing from the suspension device such that the body coil is mounted mechanically in the magnetic resonance device.

According to one embodiment, the suspension device is removed from the magnetic resonance device after completion of the adjustment process. The body coil may previously have been fixed at the position set by the adjustment device using the attachment device. After removal, the suspension device may be stored in the vicinity of the magnetic resonance device.

One embodiment provides for the adjustment device to be removed from the magnetic resonance device after completion of the adjustment process. It is thereby provided that the presence of the adjustment device does not influence the imaging of the magnetic resonance device. In one embodiment, the adjustment device may also be stored in the vicinity of the magnetic resonance device.

According to a further embodiment, during the adjustment process, the position of the body coil is changed by the adjuster such that the position of a second location of an adjustment system is shifted relative to the position of a first location of the adjustment system. The first location is connected mechanically to a component of the magnetic resonance device, and the second location interacts mechanically with the body coil.

One advantageous embodiment provides for the distance between a reference component of the magnetic resonance device and the body coil to be measured by at least one distance sensor.

According to an advantageous embodiment, the mechanical accommodation of the body coil in the magnetic resonance device takes place using the attachment device such that a stamp of at least one support element presses against the exterior wall of the body coil. In one embodiment, the stamp of the support element is connected to a counterpart piece of the body coil provided for this purpose.

A further embodiment provides for the mechanical accommodation of the body coil in the magnetic resonance device to take place using the attachment device such that the body coil rests on at least one resting point of the support device. For example, the mechanical accommodation of the body coil may take place in that the body coil at the same time rests on the resting point and is supported by support elements.

DETAILED DESCRIPTION

Figure 1:
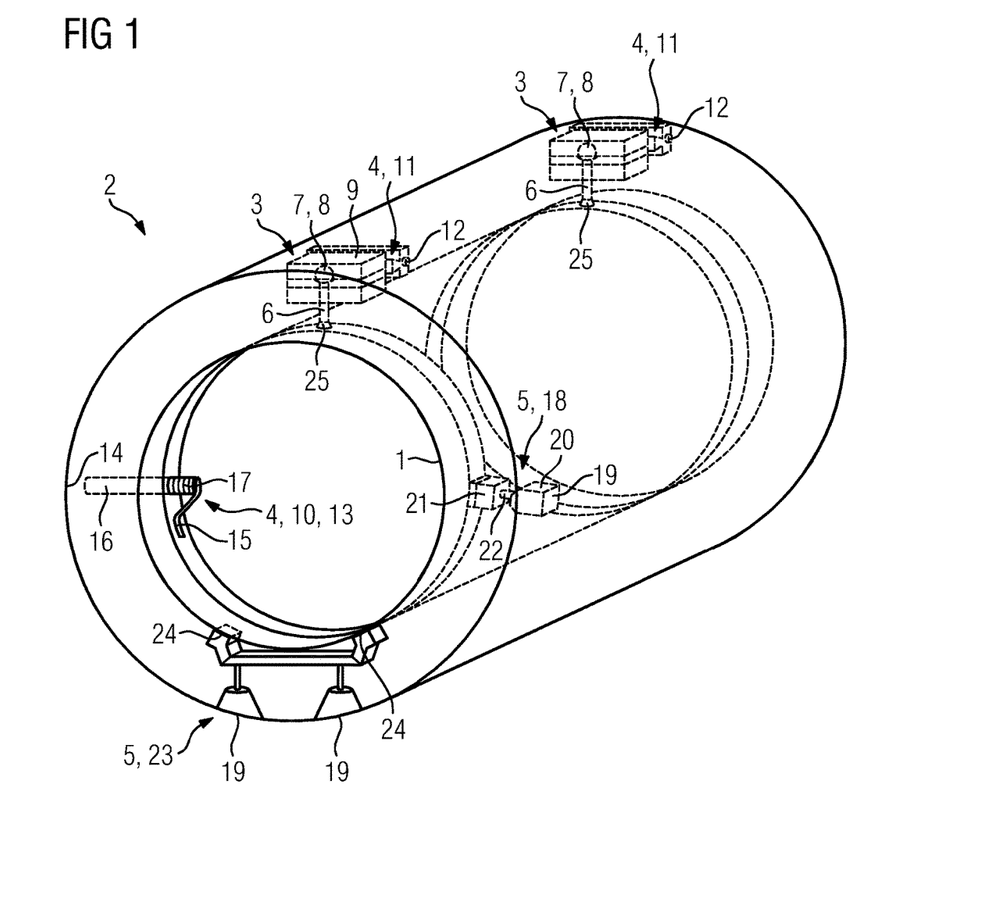
FIG. 1 shows one embodiment of a mounting device for a body coil of a magnetic resonance device.

FIG. 1 shows one embodiment of a mounting device 3,4,5 for a body coil 1 of a magnetic resonance device 2. FIG. 1 shows a suspension device 3 in each case at one end of the body coil 1 in a longitudinal direction of the body coil 1. The respective suspension element 6 of the suspension device 3 is connected on one side to a counterpart piece 25 of the body coil 1 and has on the other side a ball 7 that is mounted in a socket 8. The socket 8 of the suspension element 6 is in each case integrated into an adjustment system 11 of the adjustment device 4. The adjustment system 11 is adjusted by micrometer screws 12. FIG. 1 further shows a distance sensor 13 that is an adjustment indicator 10 of the adjustment device 4. The distance sensor 13 has a spring 15 that is connected on one end to the body coil 1 and on the other end to a measuring pin 16. On the end not pointing towards the spring 15, the measuring pin 16 presses against a reference component 14 of the magnetic resonance device 2. The measuring pin 16 further has markings 17. FIG. 1 also shows a support element 18 of the attachment device 5. The support element 18 has a mounting 20 that connects the support element 18 to an attachment location 19 of the magnetic resonance device 2. The support element 18 further has a plunger or stamp 21 that presses against an exterior surface of the body coil 1. A damping mechanism 22 is implemented between the mounting 20 and the stamp 21.

FIG. 1 further shows a support device 23 of the attachment device 5. The support device 23 is connected to the magnetic resonance device 2 at two attachment locations 19. The support device 23 has two resting points 24, upon which the body coil 1 lies.

Figure 2:
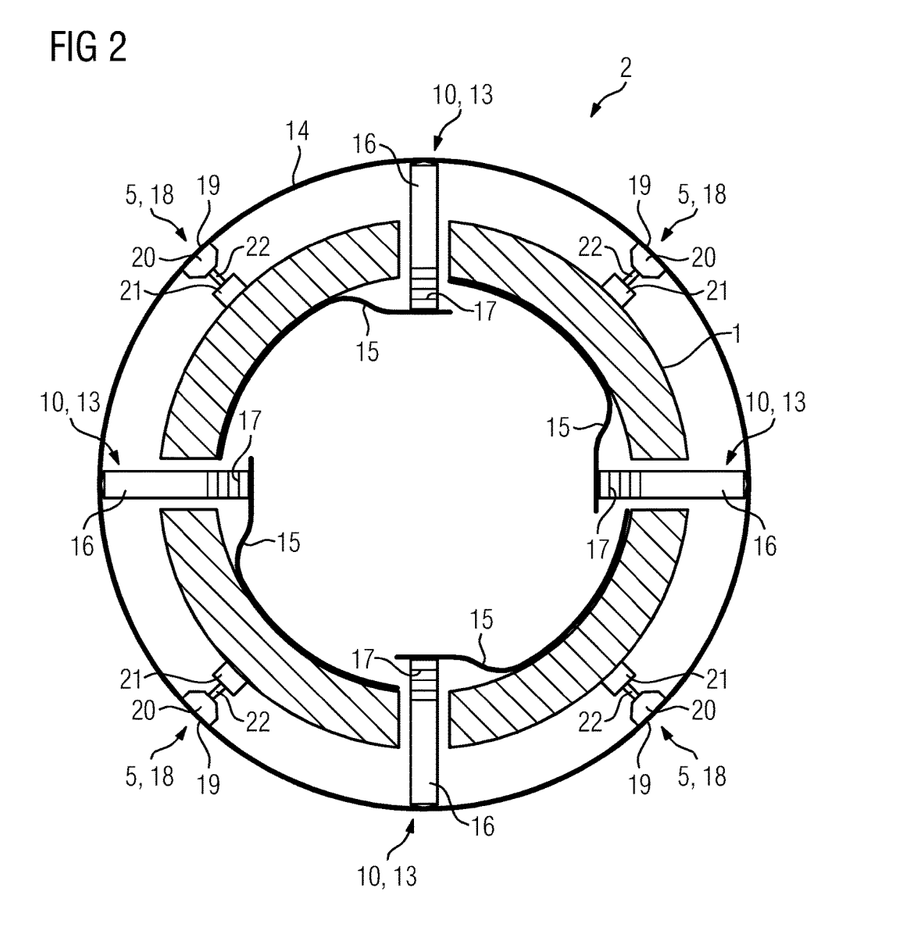
FIG. 2 shows a cross-section through one embodiment of a mounting device.

FIG. 1 shows, in each case solely by way of example, one support element 18, one distance sensor 13 and one support device 24. The use of in each case more than three (e.g., four) support elements 18 and distance sensors 13 at both ends of the body coil 1 in the longitudinal direction of the body coil 1, as shown in FIG. 2, is, however, advantageous. The use of at least two support devices 23 is likewise advantageous. In addition, only part of the adjustment system 11, which enables one readjustment of the position of the body coil 1 in one spatial direction, is shown. In reality, the adjustment system 11 provides a readjustment of the position of the body coil 1 in all three spatial directions.

The suspension of the body coil 1 at two suspension points at both ends in the longitudinal direction of the body coil 1, as shown in FIG. 1, is advantageous. The body coil 1 may, however, be suspended at more suspension points. The suspension element 6 is connected to an adjustable location of the adjustment system 11, so that a resetting of the adjustment system 11 results in a shift of the suspension element 6 and thus leads to a shifting of the body coil 1.

The adjustment system 11 is realized as a sliding rail system, as shown in FIG. 1. The readjustment of the adjustment system 11 takes place using the readjustment of a micrometer screw 12. The adjustment system 11 may alternatively also be embodied as a jointed mechanism.

The distance sensor shown 13 measures a distance between the body coil 1 and the reference component 14 of the magnetic resonance device 2. The end of the measuring pin 16 not pointing towards the spring 15 presses against the reference component 14. The position of the measuring pin 16 thereby shifts. Markings 17 show the position of the measuring pin 16.

The support devices 23 shown for the body coil 1 enable the weight of the body coil 1 to rest on the resting points 24 of the support devices 23, and thus a stabilization of the body coil 1. A support device 23 may also have just one resting point 24 or a plurality of resting points 24, as shown. The form and arrangement of the resting points 24 may be matched to the exterior surface of the body coil 1. A mechanical accommodation of the body coil 1 that completely dispenses with the use of a support device 23 may also be provided.

FIG. 2 shows a cross-section through one embodiment of a mounting device 3, 4, 5. FIG. 2 shows four distance sensors 13 that are arranged evenly distributed and at regular intervals over the entire extent of the body coil 1. Four support elements 18 that fix the body coil 1 within the magnetic resonance device 2 are shown. Not shown are a suspension device 3, a support device 23, and the adjustment device 9 (e.g., an adjuster).

FIG. 2 shows one possible configuration of the distance sensors 13 and support elements 18. A number of support elements 18 and distance sensors 13 varying from this may also be provided. The use of more distance sensors 13 may lead to a more precise determining of the position of the body coil 1 in relation to the reference component 14 of the magnetic resonance device 2.

The stamps 21 of the support elements 18 shown may be tightened crosswise in an infinitely variable manner, so that a preceding adjustment of the body coil 1 on the attachment of the body coil 1 is not influenced retroactively.

Figure 3:
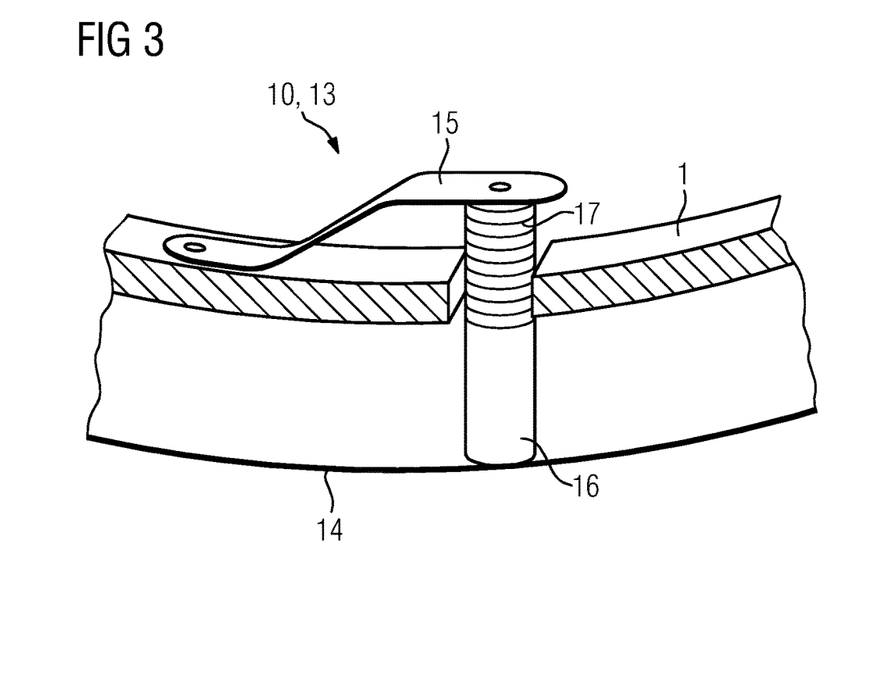
FIG. 3 shows a distance sensor of an adjustment device of one embodiment of a mounting device.

FIG. 3 shows a distance sensor 13 that is an adjustment indicator 10 of an adjustment device 4 of one embodiment of a mounting device 3, 4, 5. The end of the measuring pin 16 of the distance sensor 13 not pointing towards the spring 15 presses against the reference component 14 of the magnetic resonance device 2. The position of the measuring pin 16 is thereby shifted, and the spring 15 tensioned. The spring 15 is configured such that the measuring pin 16 may be shifted within a typical distance. The spring 15 is connected on one end to the body coil 1. After termination of the adjustment process, the springs 15 and the measuring pin 16, for example, may be removed by being unscrewed from the body coil 1. The remaining holes in the body coil 1, through which the measuring pins 16 have been guided, may be closed by a cover. The markings 17 shown on the end of the measuring pin 16 pointing towards the spring 15 enable the position of the measuring pin 16 to be read off. The markings 17 may also be embodied in a different manner than shown or positioned in a different location than shown. Color-graduated marking 17 or the specification of a scale as a marking 17 may also be provided.

Figure 4:
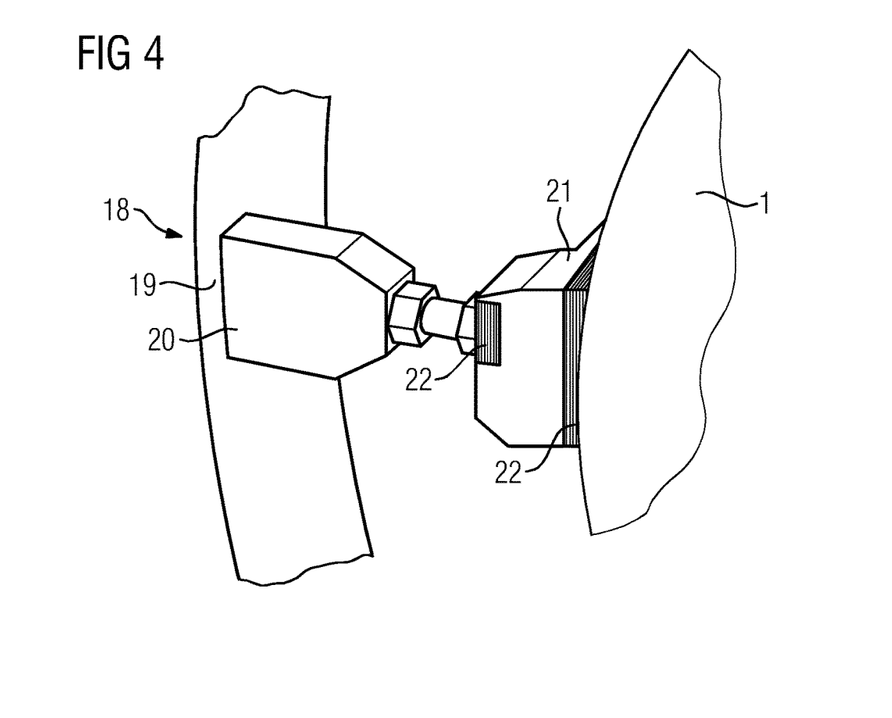
FIG. 4 shows a support element of an attachment device of one embodiment of a mounting device.

FIG. 4 shows a support element 18 of one embodiment of a mounting device 3, 4, 5 for a body coil 1. The support element 18 includes a mounting 20 that points towards the attachment location 19 of the magnetic resonance device 2, which connects the support element 18 to the attachment location 19 of the magnetic resonance device 2. The support element 18 includes a stamp 21 adjustable along a longitudinal axis of the support element 18 for mechanical fixing of the body coil 1. A damping mechanism 22 is implemented between the mounting 20 and the stamp 21.

In the case illustrated, the position of the stamp 21 is adjusted by a setting screw that is installed between the mounting 20 and the damping mechanism 22. The setting of the stamp 21 may take place in an infinitely variable manner. The tightening torque of the setting screw may also be regulated, so that the stamp 21 presses against the exterior surface of the body coil 1 with a defined force.

The damping mechanism 22 shown includes two coordinated spring elements. In the case shown, the contact surface between the support element 18 and the exterior surface of the body coil 1 is of deformable design. Depending on the desired application, the contact surface may also be embodied in rigid form.

Although the invention has been illustrated and described in greater detail by the exemplary embodiments, the invention is not limited by the disclosed example. Other variations may be derived herefrom by the person skilled in the art without departing from the scope of protection of the invention.

One or more of the present embodiments relate to a mounting device 3, 4, 5 for a body coil 1 of a magnetic resonance device 2, a magnetic resonance device 2 with such a mounting device 3, 4, 5, and a method for the mounting of a body coil 1 in a magnetic resonance device 2. In order to enable the attachment and adjustment of the body coil 1 to take place separately from each other during the mounting of the body coil 1, the mounting device 3, 4, 5 has the following elements: a suspension device 3 that has at least one suspension element 6, which is embodied such that the at least one suspension element 6 may be connected mechanically to a counterpart piece 25 of the body coil 1, where the suspension device 3 is provided for suspension and coarse adjustment of the body coil 1 in the magnetic resonance device 2 during an adjustment process of the body coil 1; an adjustment device 4 including an adjustment device 9 for changing the position of the body coil 1, and adjustment indicators 10 for displaying the position of the body coil 1, where the adjustment device 4 is provided for fine adjustment of the body coil 1 during the adjustment process; and an attachment device 5 differing from the suspension device 3, which includes at least one attachment element 18, 23 provided for mechanical interaction with the body coil 1. The attachment device 5 is provided for mechanical accommodation of the body coil 1 in the magnetic resonance device 2.

The elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A mounting device for a body coil of a magnetic resonance device, the mounting device comprising:
   a suspension device comprising at least one suspension element, the at least one suspension element being mechanically connectable to a counterpart piece of the body coil, wherein the suspension device is configured for suspension and coarse adjustment of the body coil in the magnetic resonance device during an adjustment process of the body coil;
   an adjustment device comprising:
      an adjuster configured for changing a position of the body coil; and
      adjustment indicators operable to display the position of the body coil, wherein the adjustment device is configured for fine adjustment of the body coil during the adjustment process; and
   an attachment device differing from the suspension device, the attachment device comprising at least one attachment element configured for mechanical interaction with the body coil, wherein the attachment device is configured for mechanical accommodation of the body coil in the magnetic resonance device.

2. The mounting device of claim 1, wherein the at least one suspension element is positionable along an axis defined by the gravitational effect of the body coil on a side opposite to the gravitational effect of the body coil.

3. The mounting device of claim 1, wherein the at least one suspension element is configured as a ball joint, the ball joint being connectable at one end to a counterpart piece of the body coil and comprising a ball at the other end, the ball being mounted movably in a socket, and wherein a position of the ball is lockable within the socket.

4. The mounting device of claim 1, wherein the adjuster comprises at least one adjustment system,
wherein the adjustment system is mechanically connectable to a component of the magnetic resonance device at a first location, and the adjustment system has a second location that interacts mechanically with the body coil, and
wherein a position of the second location is adjustable relative to a position of the first location.

5. The mounting device of claim 4, wherein the adjustment system is connectable to the suspension device at the second location.

6. The mounting device of claim 4, wherein the adjuster comprises micrometer screws configured to enable a readjustment of the position of the second location of the adjustment system relative to the position of the first location of the adjustment system.

7. The mounting device of claim 6, wherein the micrometer screws include markings that enable a reproducible setting of the micrometer screws.

8. The mounting device of claim 1, wherein the adjustment indicators comprise at least one distance sensor, and wherein the at least one distance sensor is configured to measure a distance between a reference component of the magnetic resonance device and the body coil.

9. The mounting device of claim 8, wherein the distance sensor comprises a spring, and wherein a first end of the spring is fixed to the body coil, and a measuring pin is attached to a second end of the spring, an end of the measuring pin not pointing towards the spring being orientable in a direction of the reference component of the magnetic resonance device.

10. The mounting device of claim 9, wherein the measuring pin comprises markings that are disposed in stages along the measuring pin, so that the markings enable the distance between the body coil and the reference component of the magnetic resonance device to be read off.

11. The mounting device of claim 1, wherein the at least one attachment element is configured as a support element,
wherein the support element comprises a mounting on an end pointing towards an attachment location of the magnetic resonance device, the mounting enabling a mechanical connection of the support element to the attachment location, and
wherein the support element comprises a stamp on an end opposite to the end pointing towards the attachment location and adjustable in a direction of a longitudinal axis of the support element for a mechanical fixing of the body coil.

12. The mounting device of claim 11, wherein the support element comprises an adjustable damping mechanism between the mounting and the stamp.

13. The mounting device of claim 1, wherein the at least one attachment element is configured as a support device for the body coil, and
wherein the support device is configured for mechanical connection of an attachment location of the magnetic resonance device and has at least one resting point for the body coil.

14. A magnetic resonance device comprising:
a mounting device for a body coil of the magnetic resonance device, the mounting device comprising:
a suspension device comprising at least one suspension element, the at least one suspension element being mechanically connectable to a counterpart piece of the body coil, wherein the suspension device is configured for suspension and coarse adjustment of the body coil in the magnetic resonance device during an adjustment process of the body coil;
an adjustment device comprising:
an adjuster configured for changing a position of the body coil; and
adjustment indicators operable to display the position of the body coil, wherein the adjustment device is configured for fine adjustment of the body coil during the adjustment process; and
an attachment device differing from the suspension device, the attachment device comprising at least one attachment element configured for mechanical interaction with the body coil, wherein the attachment device is configured for mechanical accommodation of the body coil in the magnetic resonance device.

15. A method for mounting a body coil in a magnetic resonance device, the method comprising:
suspending and coarsely adjusting the body coil using a suspension device during an adjustment process of the body coil in the magnetic resonance device, wherein the body coil is connected mechanically to the suspension device by at least one suspension element;
finely adjusting the body coil using an adjustment device during the adjustment process, wherein a position of the body coil changes by an adjuster and is indicated by adjustment indicators; and
the body coil interacting mechanically with at least one attachment element of an attachment device differing from the suspension device such that the body coil is mounted mechanically in the magnetic resonance device.

16. The method of claim 15, further comprising removing the suspension device from the magnetic resonance device after completion of the adjustment process.

17. The method of claim 15, further comprising removing the adjustment device from the magnetic resonance device after completion of the adjustment process.

18. The method of claim 15, further comprising changing, during the adjustment process, the position of the body coil using the adjuster such that a position of a second location of an adjustment system is shifted relative to a position of a first location of the adjustment system,
wherein the first location is connected mechanically to a component of the magnetic resonance device, and the second location interacts mechanically with the body coil.

19. The method of claim 15, further comprising measuring, using at least one distance sensor, a distance between a reference component of the magnetic resonance device and the body coil.

20. The method of claim 15, wherein a mechanical accommodation of the body coil in the magnetic resonance device takes place using the attachment device such that a stamp of at least one support element presses against an exterior wall of the body coil.

21. The method of claim 20, wherein a mechanical accommodation of the body coil in the magnetic resonance device using the attachment device takes place such that the body coil rests on at least one resting point of a support device.

\* \* \* \* \*